US011424137B2

(12) United States Patent
Gouk et al.

(10) Patent No.: US 11,424,137 B2
(45) Date of Patent: Aug. 23, 2022

(54) DRYING PROCESS FOR HIGH ASPECT RATIO FEATURES

(71) Applicant: Applied Materials, Inc., Santa Clara, CA (US)

(72) Inventors: Roman Gouk, San Jose, CA (US); Han-Wen Chen, Cupertino, CA (US); Steven Verhaverbeke, San Francisco, CA (US); Jean Delmas, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/417,124

(22) Filed: May 20, 2019

(65) Prior Publication Data

US 2019/0273002 A1 Sep. 5, 2019

Related U.S. Application Data

(62) Division of application No. 15/268,158, filed on Sep. 16, 2016, now Pat. No. 10,304,703.

(Continued)

(51) Int. Cl.

*H01L 21/67* (2006.01)
*C11D 11/00* (2006.01)

(Continued)

(52) U.S. Cl.

CPC ...... *H01L 21/67034* (2013.01); *B08B 7/0021* (2013.01); *B08B 7/0035* (2013.01);

(Continued)

(58) Field of Classification Search

CPC ....... H01L 21/67034; H01L 21/020101; H01L 21/67126; H01L 21/6719; H01L 21/68792;

(Continued)

(56) References Cited

U.S. PATENT DOCUMENTS 5,417,768 A 5/1995 Smith, Jr. et al.
5,968,273 A 10/1999 Kadomura et al.

(Continued)

FOREIGN PATENT DOCUMENTS

CN 1497667 A 5/2004
CN 1958177 A 5/2007

(Continued)

OTHER PUBLICATIONS

Office Action for Korean Application No. 10-2018-7012657 dated May 21, 2019.

(Continued)

*Primary Examiner* — Eric W Golightly
*Assistant Examiner* — Arlyn I Rivera-Cordero
(74) *Attorney, Agent, or Firm* — Patterson + Sheridan, LLP

(57) ABSTRACT

Embodiments described herein generally relate to a processing chamber incorporating a small thermal mass which enable efficient temperature cycling for supercritical drying processes. The chamber generally includes a body, a liner, and an insulation element which enables the liner to exhibit a small thermal mass relative to the body. The chamber is also configured with suitable apparatus for generating and/or maintaining supercritical fluid within a processing volume of the chamber.

20 Claims, 6 Drawing Sheets

Related U.S. Application Data

(60) Provisional application No. 62/236,912, filed on Oct. 4, 2015.

(51) Int. Cl.
*H01L 21/02* (2006.01)
*H01L 21/687* (2006.01)
*H01L 21/677* (2006.01)
*B08B 7/00* (2006.01)

(52) U.S. Cl.
CPC .... *C11D 11/0047* (2013.01); *H01L 21/02101* (2013.01); *H01L 21/6719* (2013.01); *H01L 21/67126* (2013.01); *H01L 21/68792* (2013.01); *H01L 21/6704* (2013.01); *H01L 21/67739* (2013.01); *H01L 21/67748* (2013.01)

(58) Field of Classification Search
CPC ........... H01L 21/6704; H01L 21/67739; H01L 21/67748; C11D 11/0047; B08B 7/0021; B08B 7/0035
See application file for complete search history.

(56) References Cited

U.S. PATENT DOCUMENTS

| | | | |
|---|---|---|---|
| 6,168,668 | B1 | 1/2001 | Yudovsky |
| 6,216,364 | B1 | 4/2001 | Tanaka et al. |
| 6,286,231 | B1 | 9/2001 | Bergman et al. |
| 6,306,564 | B1 | 10/2001 | Mullee |
| 6,334,266 | B1 | 1/2002 | Moritz et al. |
| 6,508,259 | B1 | 1/2003 | Tseronis et al. |
| 6,562,146 | B1 | 5/2003 | DeYoung et al. |
| 6,745,494 | B2 | 6/2004 | Bergman et al. |
| 6,764,552 | B1 | 7/2004 | Joyce et al. |
| 6,793,836 | B2 | 9/2004 | Tsung-Kuei et al. |
| 6,843,855 | B2 | 1/2005 | Verhaverbeke |
| 6,848,458 | B1 | 2/2005 | Shrinivasan et al. |
| 7,000,621 | B1 | 2/2006 | Verhaverbeke |
| 7,384,484 | B2 | 6/2008 | Muraoka et al. |
| 2001/0004478 | A1 | 6/2001 | Zhao et al. |
| 2002/0195121 | A1 | 12/2002 | Kittle |
| 2003/0022487 | A1 | 1/2003 | Yoon et al. |
| 2003/0026677 | A1 | 2/2003 | Sakashita et al. |
| 2003/0075536 | A1 | 4/2003 | Mack et al. |
| 2003/0084918 | A1 | 5/2003 | Kim |
| 2003/0102017 | A1 | 6/2003 | Taniyama |
| 2003/0172954 | A1 | 9/2003 | Verhaverbeke |
| 2003/0177659 | A1 | 9/2003 | Saito et al. |
| 2004/0072706 | A1 | 4/2004 | Arena-Foster et al. |
| 2004/0139986 | A1* | 7/2004 | Mount .................. B08B 7/0021 134/1.3 |
| 2004/0198066 | A1 | 10/2004 | Verhaverbeke |
| 2005/0191861 | A1 | 9/2005 | Verhaverbeke |
| 2005/0242064 | A1 | 11/2005 | Saito et al. |
| 2006/0223899 | A1 | 10/2006 | Hillman et al. |
| 2007/0221252 | A1 | 9/2007 | Kiyose |
| 2007/0287277 | A1 | 12/2007 | Kolics et al. |
| 2007/0295365 | A1 | 12/2007 | Miya et al. |
| 2008/0153276 | A1 | 6/2008 | Hwang et al. |
| 2008/0224379 | A1 | 9/2008 | McNamara |
| 2009/0130858 | A1 | 5/2009 | Levy |
| 2009/0151754 | A1 | 6/2009 | Zhu et al. |
| 2010/0192978 | A1* | 8/2010 | Plavidal .................... B08B 3/00 134/19 |
| 2011/0146909 | A1 | 6/2011 | Shih et al. |
| 2012/0055405 | A1 | 3/2012 | Koelmel et al. |
| 2012/0085495 | A1 | 4/2012 | Lee et al. |
| 2012/0103264 | A1 | 5/2012 | Choi et al. |
| 2012/0111379 | A1 | 5/2012 | Nixon et al. |
| 2012/0304485 | A1* | 12/2012 | Hayashi ............ H01L 21/02057 34/415 |
| 2013/0028690 | A1* | 1/2013 | Park .................. H01L 21/67748 414/222.01 |
| 2013/0192628 | A1 | 8/2013 | Mori et al. |
| 2013/0194350 | A1 | 8/2013 | Watanabe et al. |
| 2013/0224956 | A1* | 8/2013 | Negoro ............. H01L 21/31111 438/697 |
| 2013/0302982 | A1 | 11/2013 | Tung et al. |
| 2013/0318812 | A1 | 12/2013 | Kim et al. |
| 2014/0144462 | A1* | 5/2014 | Verhaverbeke ... H01L 21/67034 134/1.2 |
| 2014/0283746 | A1 | 9/2014 | Seo et al. |
| 2015/0221539 | A1 | 8/2015 | Ouye |
| 2015/0262859 | A1 | 9/2015 | Balasubramanian et al. |

FOREIGN PATENT DOCUMENTS

| | | | | |
|---|---|---|---|---|
| CN | 1960813 | A | | 5/2007 |
| CN | 101030551 | A | | 9/2007 |
| CN | 100435276 | C | | 11/2008 |
| CN | 102386052 | A | | 3/2012 |
| CN | 103151285 | A | | 6/2013 |
| CN | 103295936 | A | | 9/2013 |
| CN | 103403843 | A | | 11/2013 |
| CN | 104919574 | A | | 9/2015 |
| EP | 1172458 | A2 | | 1/2002 |
| JP | H07-142378 | A | | 6/1995 |
| JP | H10-135171 | A | | 5/1998 |
| JP | 2000340540 | A | | 12/2000 |
| JP | 2001-77074 | A | | 3/2001 |
| JP | 2003-51474 | A | | 2/2003 |
| JP | 2003-282510 | A | | 10/2003 |
| JP | 2003-282524 | A | | 10/2003 |
| JP | 2004186526 | A | | 7/2004 |
| JP | 2004-249189 | A | | 9/2004 |
| JP | 2004-311507 | A | | 11/2004 |
| JP | 2005-116759 | A | | 4/2005 |
| JP | 2005116759 | A | * | 4/2005 |
| JP | 2005-138063 | A | | 6/2005 |
| JP | 2005-333015 | A | | 12/2005 |
| JP | 2006-179913 | A | | 7/2006 |
| JP | 2007-49065 | A | | 2/2007 |
| JP | 2008-034656 | A | | 2/2008 |
| JP | 2008066707 | A | | 3/2008 |
| JP | 2008-73611 | A | | 4/2008 |
| JP | 2008-98558 | A | | 4/2008 |
| JP | 2008-159789 | A | | 7/2008 |
| JP | 2010-045170 | A | | 2/2010 |
| JP | 2011-040572 | A | | 2/2011 |
| JP | 2012-503883 | A | | 2/2012 |
| JP | 2012-124441 | A | | 6/2012 |
| JP | 2012-204656 | A | | 10/2012 |
| JP | 2013-105777 | A | | 5/2013 |
| JP | 2013-120944 | A | | 6/2013 |
| JP | 2013-179244 | A | | 9/2013 |
| JP | 2014049605 | | | 3/2014 |
| JP | 2014-241450 | A | | 12/2014 |
| JP | 2015-144239 | A | | 8/2015 |
| KR | 10-0171945 | | | 3/1999 |
| KR | 10-2005-0032943 | A | | 4/2005 |
| KR | 20070017255 | | | 2/2007 |
| KR | 100730348 | B1 | | 6/2007 |
| KR | 10-2005-0063720 | | | 11/2007 |
| KR | 10-2008-0002633 | | | 1/2008 |
| KR | 10-0822373 | B1 | | 4/2008 |
| KR | 10-2010-0128123 | A | | 12/2010 |
| KR | 10-2013-0063761 | | | 6/2013 |
| KR | 10-2014-0030218 | A | | 3/2014 |
| KR | 10-2014-0115795 | A | | 10/2014 |
| KR | 20150034992 | A | | 4/2015 |
| KR | 10-2015-0088829 | A | | 8/2015 |
| TW | I233147 | B | | 5/2005 |
| TW | I245322 | B | | 12/2005 |
| TW | 200834782 | A | | 8/2008 |
| TW | 201218296 | A | | 5/2012 |
| TW | 201241895 | A | | 10/2012 |
| TW | 201306105 | A | | 2/2013 |
| TW | 201426850 | A | | 7/2014 |
| TW | 201534407 | A | | 9/2015 |
| WO | 2010/036575 | A2 | | 4/2010 |

(56) References Cited

FOREIGN PATENT DOCUMENTS

| | | | |
|---|---|---|---|
| WO | 2011/103062 | A2 | 8/2011 |
| WO | 2012133583 | A1 | 10/2012 |

OTHER PUBLICATIONS

Office Action for Korean Application No. 10-2018-7012655 dated May 21, 2019.
Office Action for Korean Application No. 10-2018-7012656 dated May 21, 2019.
Office Action for Japanese Application No. 2018-517344 dated Jun. 4, 2019.
Search Report for Taiwan Application No. 108125950 dated Oct. 18, 2019.
Office Action for Japan Application No. 2018-517285 dated Oct. 23, 2019.
International Search Report an Written Opinion for International Application No. PCT/US2016/051341 dated Dec. 20, 2016.
International Search Report & Written Opinion dated Mar. 17, 2014 for Application No. PCT/US2013/071314.
International Search Report and Written Opinion of related application PCT/US2016/051480 dated Jan. 5, 2017.
International Search Report and Written Opinion of related application PCT/US2016/051520 dated Dec. 26, 2016.
International Search Report and Written Opinion for related application PCT/US2016/051582 dated Dec. 22, 2016.
International Search Report and Written Opinion, PCT/US2015/039974, dated Oct. 29, 2015.
Search Report for Taiwan Application No. 105131202 dated Feb. 22, 2019.
Office Action for Japanese Application No. 2018-546484 dated Oct. 8, 2019.
Search Report for Taiwan Application No. 105131243 dated Aug. 19, 2019.
Search Report for Taiwan Application No. 105130171 dated Jul. 9, 2019.
Notice of Allowance for Japan Application No. 2018-517344 dated Dec. 2, 2019.
Office Action for Korean Application No. 10-2015-7016291 dated Dec. 19, 2019.
Office Action for Japanese Application No. 2019-232387 dated Oct. 27, 2020, 4 pages.
JP Office Action dated Jul. 8, 2020 for Application No. 2019-129241, 11 pages.
Taiwan Notice of Allowance for Application No. 108135965, dated Apr. 16, 2021; 6 pages.
Office Action for Japanese Application No. 2019-129241 dated Dec. 1, 2020, 8 pages.
Korean Office Action dated Feb. 26, 2021, for Korean Patent Application No. 10-2020-7034920, 4 pages.
Japanese Decision to Grant a Patent dated Jun. 29, 2021, for Japanese Patent Application No. 2019-232387, 4 pages.
Office Action for Taiwan Application No. 109104464 dated Aug. 23, 2021, 2 pages.
Search Report for Taiwan Application No. 109104464 dated Jul. 26, 2021, 2 pages.
Office Action for Chinese Application No. 2016800582940 dated Aug. 31, 2021, 5 pages.
Search Report for Chinese Application No. 2016800582940 dated Aug. 24, 2021, 6 pages.
Search Report for Chinese Application No. 201680057046.4 dated Aug. 20, 2021, 2 pages.
Office Action for Chinese Application No. 201680054443.6 dated Sep. 3, 2021, 15 pages.
Search Report for Chinese Application No. 201680054443.6 dated Sep. 3, 2021, 6 pages.
Chinese Office Action dated Apr. 6, 2022 for Application No. 201680058294.0, 9 pages.
Office Action for Chinese Application No. 201680054443.6 dated Mar. 29, 2022, 3 pages.
Search Report for Chinese Application No. 201680054443.6 dated Mar. 21, 2022, 4 pages.
Chinese Office Action dated Mar. 28, 2022 for Application No. 201680058300.2, 9 pages.

* cited by examiner 500
202
206
300
312
502
504
506
342
340

DRYING PROCESS FOR HIGH ASPECT RATIO FEATURES

CROSS-REFERENCE TO RELATED APPLICATIONS

This application claims priority to U.S. patent application Ser. No. 15/268,158, filed Sep. 16, 2016 which claims priority to U.S. Provisional Patent Application No. 62/236,912, filed Oct. 4, 2015, the entirety of which is herein incorporated by reference.

BACKGROUND

Field

Embodiments of the present disclosure generally relate to supercritical drying apparatus. More specifically, embodiments described herein relate to a small thermal mass pressurized chamber.

Description of the Related Art

In the cleaning of semiconductor devices, it is often desirable to remove liquid and solid contaminants from surfaces of a substrate, thus leaving clean surfaces. Wet cleaning processes generally involve the use of cleaning liquids, such as aqueous cleaning solutions. After wet cleaning the substrate, it is often desirable to remove the cleaning liquid from the surface of the substrate in a cleaning chamber.

Most current wet cleaning techniques utilize a liquid spraying or immersion step to clean the substrate. Drying of the substrate that has high aspect ratio features or low-k materials which have voids or pores is very challenging subsequent to the application of a cleaning liquid. Capillary forces of the cleaning liquid often cause deformation of materials in these structures which can create undesired stiction, which can damage the semiconductor substrate in addition to leaving residue on the substrate from the cleaning solution utilized. The aforementioned challenges are especially apparent on substrates with high-aspect-ratio semiconductor device structures during subsequent drying of the substrate. Line stiction, or line collapse, results from bending of the side walls, which form the high-aspect-ratio trench or via, towards each other due to capillary pressure across the liquid-air interface over the liquid trapped in the trench or via during the wet cleaning process(es). Features with narrow line width and high-aspect-ratios are especially susceptible to the difference in surface tension created between liquid-air and liquid-wall interfaces due to capillary pressure, which is also sometimes referred to as capillary force. Current workable drying practices are facing a steeply rising challenge in preventing line stiction as a result of rapid device scaling advancements.

As a result, there is a need in the art for improved apparatus for performing supercritical drying processes.

SUMMARY

In one embodiment, a substrate processing apparatus is provided. The apparatus includes a chamber body defining a processing volume configured to operate at elevated pressures. The chamber body includes a liner disposed within the chamber body adjacent the processing volume and an insulation element disposed within the chamber body adjacent the liner. The insulation element may have a coefficient of thermal expansion similar to a coefficient of thermal expansion of the chamber body and the liner. A substrate support may be coupled to a door and a baffle plate disposed in the processing volume may be coupled to an actuator configured to move the baffle plate within the processing volume.

In another embodiment, a substrate processing apparatus is provided. The apparatus includes a platform having a transfer chamber and a processing chamber coupled thereon. The processing chamber may be disposed at a tilted angle relative to the transfer chamber. The processing chamber includes a chamber body defining a processing volume configured to operate at elevated pressures. The chamber body includes a liner disposed within the chamber body adjacent the processing volume and an insulation element disposed within the chamber body adjacent the liner. The insulation element may have a coefficient of thermal expansion similar to a coefficient of thermal expansion of the chamber body and the liner. A substrate support may be coupled to a door and a baffle plate disposed in the processing volume may be coupled to an actuator configured to move the baffle plate within the processing volume.

In yet another embodiment, a substrate processing method is provided. The method includes disposing a substrate on a substrate support in a processing chamber. The substrate support may be tilted with respect to gravity and a solvent may be introduced to the processing chamber in an amount to at least partially submerge the substrate. A baffle plate may be positioned over the substrate, supercritical $CO_2$ may be generated in the processing chamber, and the substrate may be exposed to the supercritical $CO_2$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, for purposes of explanation, numerous specific details are set forth in order to provide a thorough understanding of the embodiments provided herein. However, it will be evident to one skilled in the art that the present disclosure may be practiced without these specific details. In other instances, specific apparatus structures have not been described so as not to obscure embodiments described. The following description and figures are illustrative of the embodiments and are not to be construed as limiting the disclosure.

Figure 1:
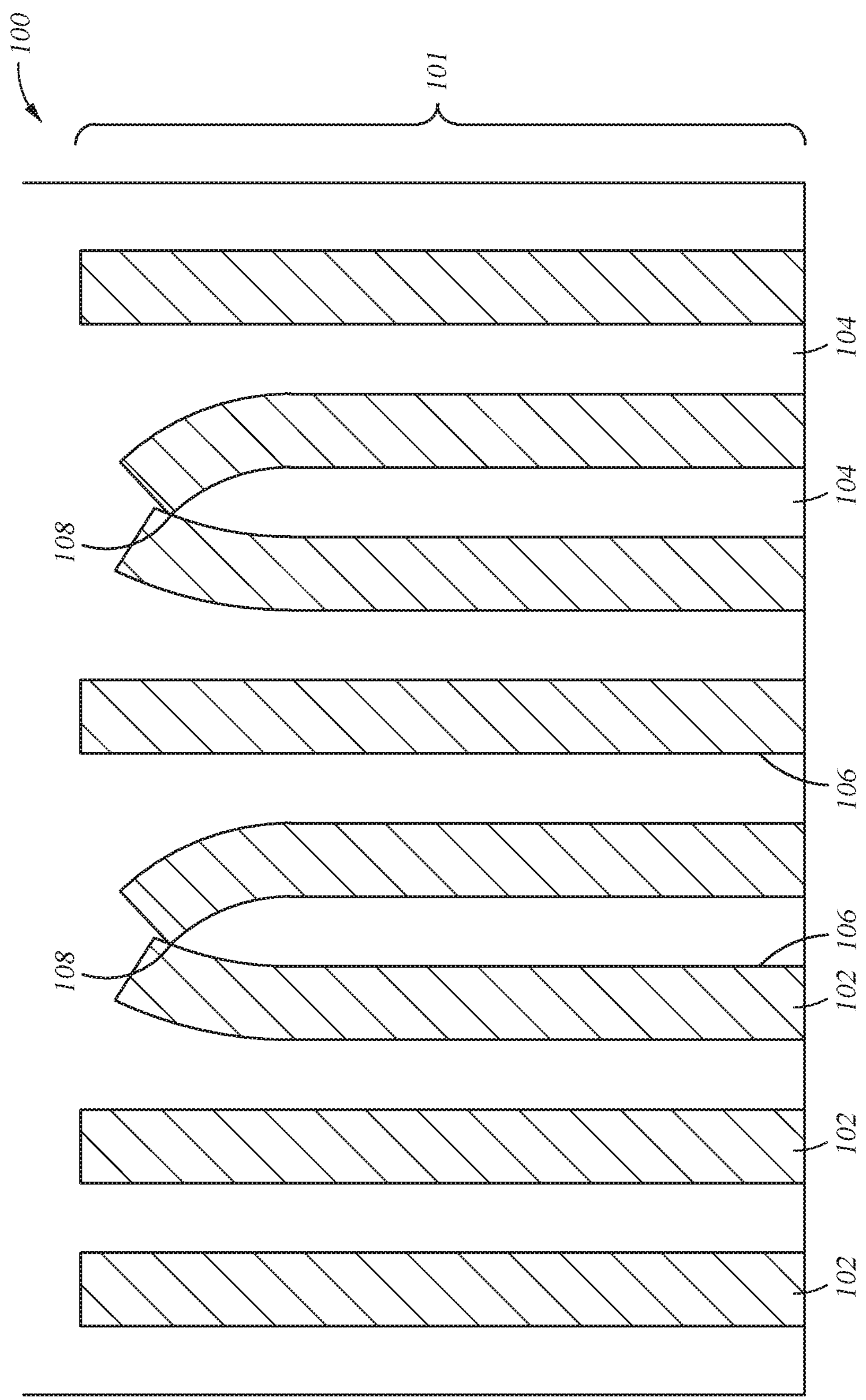
FIG. 1 illustrates the effect of stiction created between features formed on a semiconductor substrate according to embodiments described herein.

FIG. 1 is a schematic cross-sectional view that illustrates a portion of a semiconductor device 100 in which line stiction has occurred between two features within the semiconductor device 100. As shown, the high aspect ratio device structures are formed on a surface of a substrate. During processing, device structures 102 should remain in a vertical orientation and walls 106 should not cross the openings 104 and contact adjacent walls 106 of the device structures 102. When the semiconductor device 100 is being dried after being cleaned with wet chemistries, the walls 106 of the device structures 102 are subjected to capillary forces due to the air-liquid interface created by the cleaning liquid disposed within the opening 104. The capillary forces cause the walls 106 of adjacent device structures 102 to bend towards one another and contact each other. Line stiction results from the contact between walls 106 of adjacent device structures 102, ultimately causing closure of the openings 104. Line stiction is generally undesirable because it prevents access to the openings 104 during subsequent substrate processing steps, such as further deposition steps.

To prevent line stiction, a substrate may be exposed to an aqueous cleaning solution, such as de-ionized water or cleaning chemicals, in a wet clean chamber. Such a substrate includes a semiconductor substrate having electronic devices disposed or formed thereon. The use of the aqueous cleaning solutions on the substrate in a wet clean chamber removes residues left on the substrate after the wet cleaning processes have been performed. In some configurations, the wet clean chamber may be a single wafer cleaning chamber and/or a horizontal spinning chamber. Additionally, the wet clean chamber may have a megasonic plate adapted to generate acoustic energy directed onto the non-device side of the substrate.

After wet cleaning the substrate, the substrate may be transferred to a solvent exchange chamber to displace any previously used aqueous cleaning solutions used in the wet clean chamber. The substrate may then be transferred to a supercritical fluid chamber for further cleaning and drying steps to be performed on the substrate. In one embodiment, drying the substrate may involve the delivery of a supercritical fluid to a surface of the substrate. A drying gas may be selected to transition into a supercritical state when subjected to certain pressure and temperature configurations that are achieved or maintained in the supercritical processing chamber. One example of such a drying gas includes carbon dioxide ($CO_2$). Since supercritical $CO_2$ is a supercritical gas, it has no surface tension in that its surface tension is similar to a gas, but has densities that are similar to a liquid. Supercritical $CO_2$ has a critical point at a pressure of about 73.0 atm and a temperature of about 31.1° C. One unique property of a supercritical fluid, such as $CO_2$, is that condensation will not occur at any pressure above the supercritical pressure and temperatures above the supercritical point (e.g., 31.1° C. and 73 atm for $CO_2$). Critical temperature and critical pressure parameters of a processing environment, such as a processing chamber, influence the supercritical state of the $CO_2$ drying gas.

The supercritical fluid, due to its unique properties, may penetrate substantially all pores or voids in the substrate and remove any remaining liquids or particles that may be present in the openings 104. In one embodiment, after the supercritical processing has proceeded for a desired period of time to remove particles and residues, the pressure of the chamber is decreased at a nearly constant temperature, allowing the supercritical fluid to transition directly to a gaseous phase within the openings 104. Liquids typically present in the openings 104 prior to supercritical fluid treatment may be displacement solvents from the solvent exchange chamber. Particles typically present in the openings 104 may be any solid particulate matter, such as organic species (i.e., carbon), inorganic species (i.e. silicon), and/or metals. Examples of openings 104 that may be dried by supercritical fluid include voids or pores in a dielectric layer, voids or pores in a low-k dielectric material, and other types of gaps in the substrate that may trap cleaning fluids and particles. Moreover, supercritical drying may prevent line stiction by bypassing the liquid state during phase transition and eliminating capillary forces created between the walls 106 of the device structures 102 due to the due to the negligible surface tension of supercritical fluid, such as supercritical $CO_2$.

The substrate may then be transferred from the supercritical fluid chamber to a post processing chamber. The post processing chamber may be a plasma processing chamber, in which contaminants that may be present on the substrate may be removed. Post processing the substrate may also further release any line stiction present in the device structures. The processes described herein are useful for cleaning device structures having high aspect ratios, such as aspect ratios of about 10:1 or greater, 20:1 or greater, or 30:1 or greater. In certain embodiments, the processes described herein are useful for cleaning 3D/vertical NAND flash device structures.

Figure 2A:
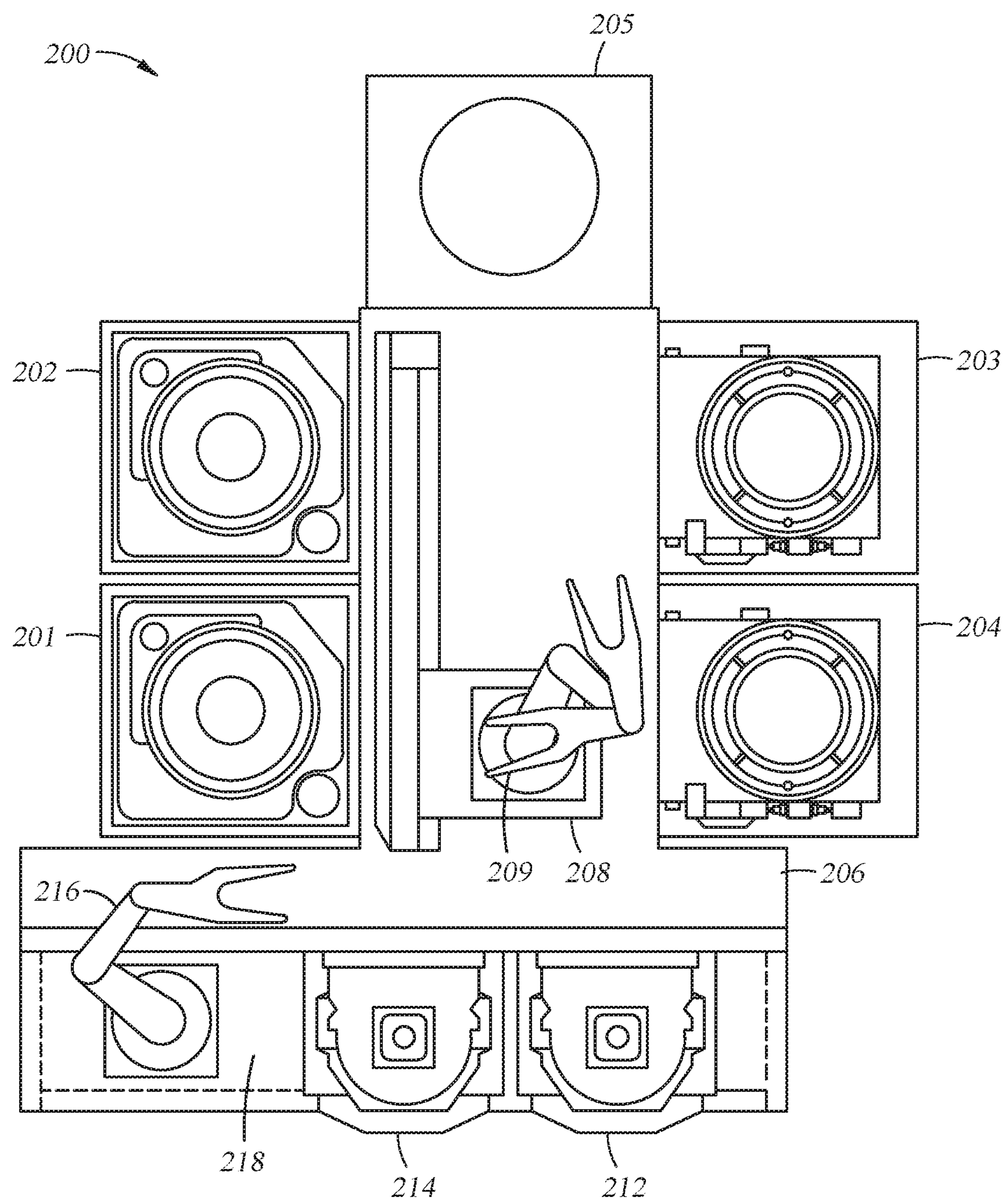
FIG. 2A illustrates a plan view of processing apparatus according to one embodiment described herein.

FIG. 2A illustrates a substrate processing apparatus that may be adapted to perform one or more of the operations described above, according to one embodiment of the present disclosure. In one embodiment, the processing apparatus 200 comprises a wet clean chamber 201, a solvent exchange chamber 202, a supercritical fluid chamber 203, a post processing chamber 204, a transfer chamber 206, and a wet robot 208. Processing a substrate may include, but is not limited to, forming electrical devices such as transistors, capacitors, or resistors, that are interconnected by metal lines, which are insulated by interlayer dielectrics upon the substrate. These processes may include cleaning the substrate, cleaning films formed on the substrate, drying the substrate, and drying films formed on the substrate. In another embodiment, the processing apparatus 200 includes an inspection chamber 205, which may include tools (not shown) to inspect substrates that have been processed in the processing apparatus 200.

In one embodiment, the substrate processing apparatus 200 is a cluster tool comprising several substrate processing chambers, such as the wet clean chamber 201, the solvent exchange chamber 202, the supercritical fluid chamber 203, the post processing chamber 204, and the transfer chamber 206. The chambers 201, 202, 203, 204 may be positioned about the wet robot 208 which may be disposed in the transfer chamber 206. The wet robot 208 comprises a motor, a base, an arm, and an end effector 209 configured to transfer substrates between the chambers. Optionally, the wet robot 208 may have multiple arms and multiple end effectors to increase the throughput of the processing apparatus 200. In one embodiment, the wet robot 208 transfers substrates between the aforementioned chambers. In another embodiment, at least one of the end effectors of the wet robot 208 is a dedicated dry end effector (e.g., adapted to handle dry wafers) and at least one of the end effectors of the wet robot 208 is a dedicated wet end effector (e.g., adapted to handle wet wafers). The dedicated dry end effector may be used to transfer substrates between the supercritical fluid chamber 203 and the post processing chamber 204.

The processing apparatus 200 also comprises a dry robot 216 disposed in a factory interface 218 which may be coupled to the processing apparatus 200 and a plurality of substrate cassettes 212 and 214, each holding a plurality of substrates to be cleaned or dried, or that have been cleaned or dried. The dry robot 216 may be configured to transfer substrates between the cassettes 212 and 214 and the wet clean chamber 201 and post processing chamber 204. In another embodiment, the dry robot 216 may be configured to transfer substrates between the supercritical fluid chamber 203 and the post processing chamber 204. The processing chambers within the processing apparatus 200 may be placed on a horizontal platform which houses the substrate transfer chamber 206. In another embodiment, a portion of the platform may be oriented in a position other than a horizontal orientation (See FIG. 5).

Figure 2B:
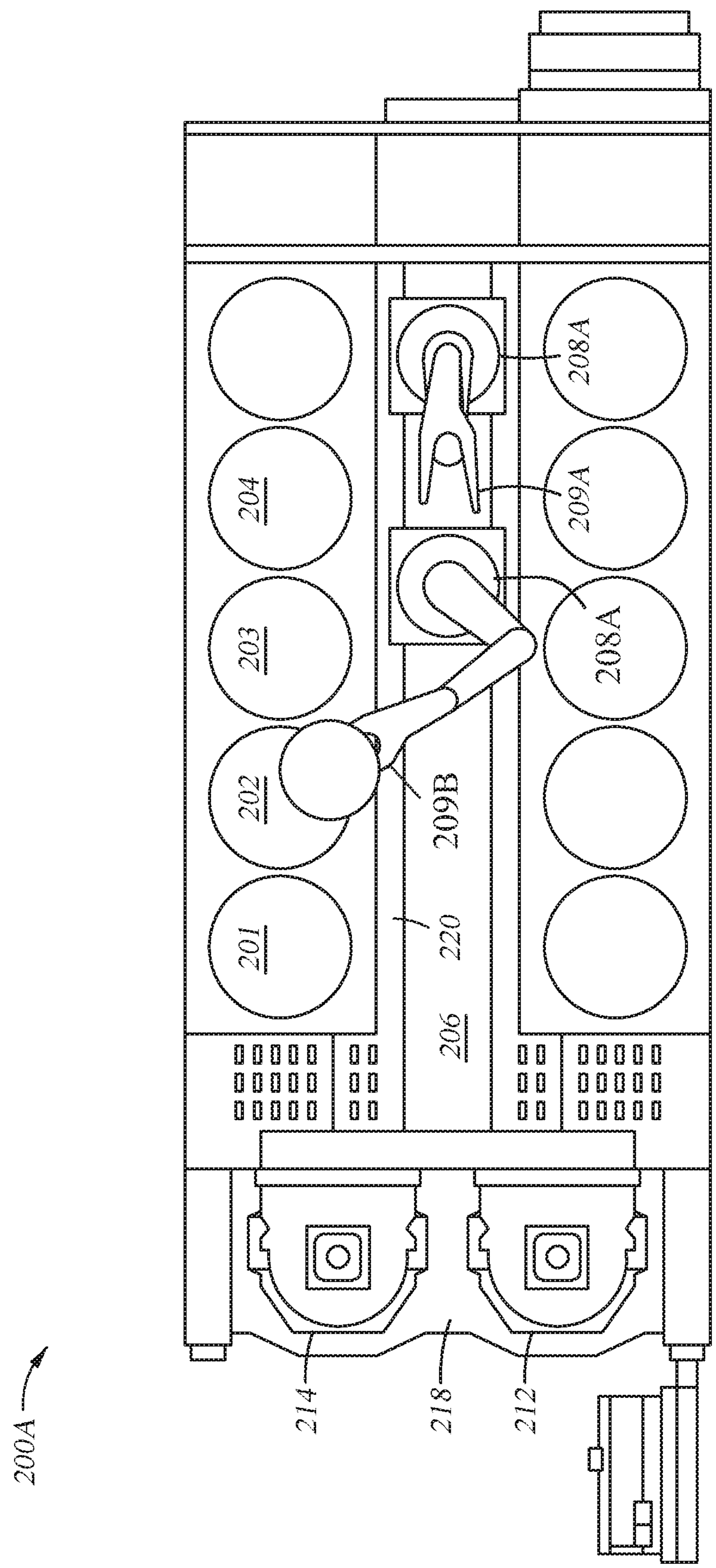
FIG. 2B illustrates a plan view of a processing apparatus according to one embodiment described herein.

In an alternate embodiment, as shown in FIG. 2B, the processing apparatus 200A may be a linear apparatus comprising several substrate processing chambers such as the wet clean chamber 201, the solvent exchange chamber 202, the supercritical fluid chamber 203, the post processing chamber 204, and the transfer chamber 206. For example, the processing apparatus 200A may be the Raider® GT available from Applied Materials, Santa Clara, Calif., however it is contemplated that other processing apparatuses from other manufacturers may be adapted to perform the embodiments described herein.

The chambers 201, 202, 203, 204 may be positioned about a robot 208A which may be disposed in the transfer chamber 206. The robot 208A comprises a motor, a base, an arm, and end effectors 209A and 209B configured to transfer substrates between the chambers. The robot 208A may have multiple arms and multiple end effectors to increase the throughput of the processing apparatus 200A. In one embodiment, the robot 208A, having a dedicated wet end effector 209A, transfers substrates between the aforementioned chambers. The processing apparatus 200A may also comprise a factory interface 218 which may be coupled to the processing apparatus 200 and a plurality of substrate cassettes 212 and 214, each holding a plurality of substrates to be cleaned or dried, or that have been cleaned or dried. The robot 208A having the dedicated dry end effector 209B, transfers substrates between the cassettes 212 and 214 and the wet clean chamber 201 and post processing chamber 204. In one embodiment, the dedicated dry end effector 209B may be configured to transfer substrates between the supercritical fluid chamber 203 and the post processing chamber 204. The chambers within the processing apparatus 200A may be placed on a horizontal platform which houses the substrate transfer chamber 206. In another embodiment, a portion of the platform may be oriented in a position other than a horizontal orientation (See FIG. 5).

In some configurations of the processing apparatus 200A, the robot 208A may travel along a linear track 220. Chambers may be arranged in sequence on one or both sides of the linear track 220. To perform wet substrate transfer, excess liquid may be remove from the substrate, such as by rotating the substrate, while still in the chamber so only a thin wet layer remains on the substrate surface before the robot 208A transfers the substrate. In embodiments providing two or more end effectors on the robot 208A, at least one may be dedicated to wet substrate transfer and the other one may be dedicated to dry substrate transfer. More chambers may be installed in the extendable linear configuration for high-volume production.

The configurations referred to in the previous embodiments greatly reduce design complexities of each chamber, enable queue time control between sensitive process steps, and optimize throughput in continuous production with adjustable chamber module count to equalize process duration of each processing operation.

Figure 3:
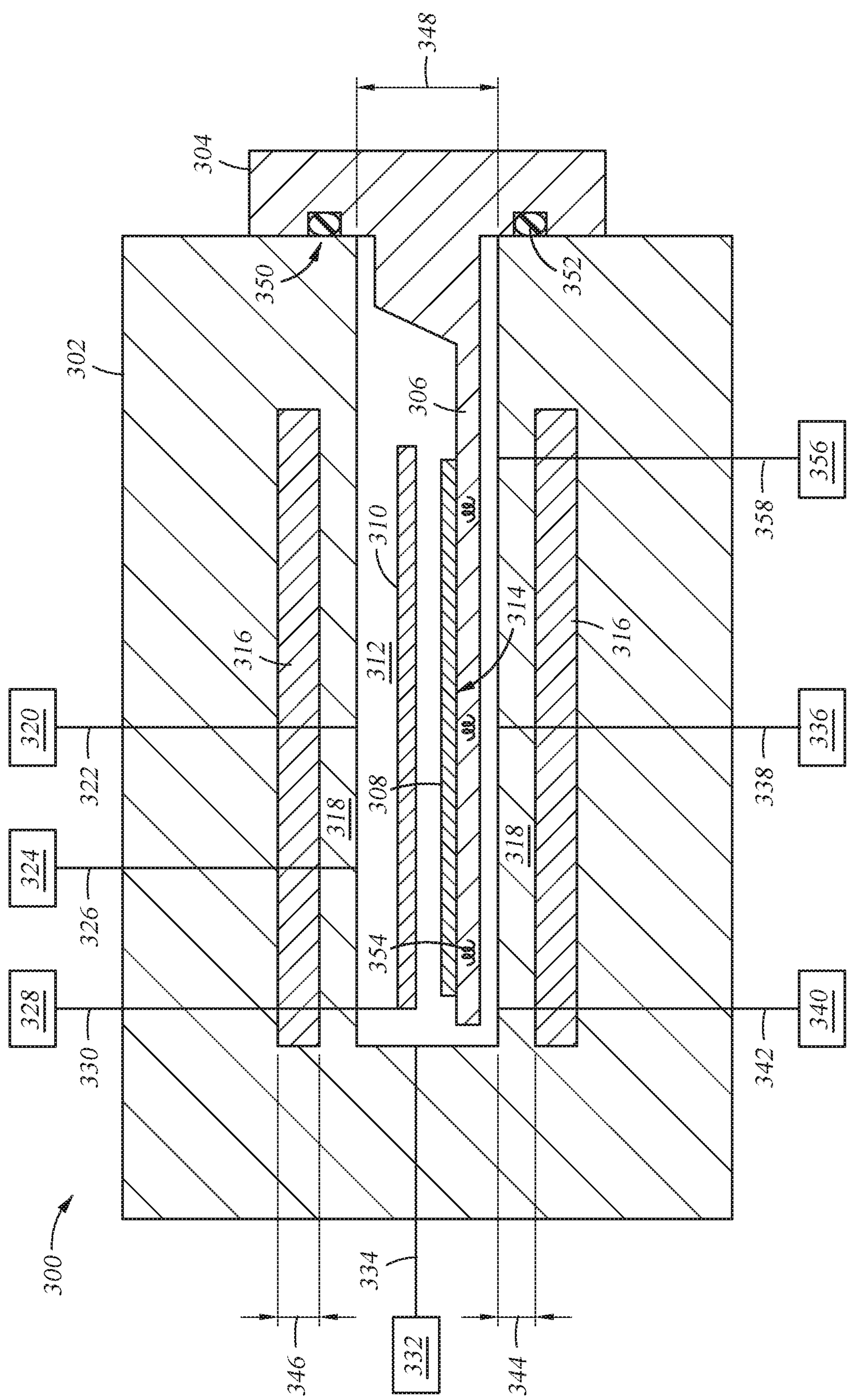
FIG. 3 schematically illustrates a cross-sectional view of a small thermal mass processing chamber according to one embodiment described herein.

FIG. 3 schematically illustrates a cross-sectional view of a small thermal mass processing chamber 300 according to one embodiment described herein. In certain embodiments, the chamber 300 may be implemented as the chamber 203 described with regard to FIG. 2A and FIG. 2B. Generally, the chamber 300 is configured to withstand pressurization suitable for generation and/or maintenance of a supercritical fluid therein. The chamber 300 may also be advantageously cycled within a temperature range suitable for performing phase transitions.

The chamber 300 includes a body 302, a liner 318, and an insulation element 316. The body 302 and the liner 318 generally define a processing volume 312. The body 302 may be configured to withstand pressures suitable for generating a supercritical fluid within the processing volume 312. For example, the body may be suitable for withstanding pressures of about 100 bar or greater. Suitable materials for the body 302 include stainless steel, aluminum, or other high strength metallic materials. The liner 318 may also be formed from materials similar to the body 302. In one embodiment, the liner 318 and the body 302 may be a unitary apparatus. In another embodiment, the liner 318 and the body 302 may be separate apparatus coupled together.

The liner 318, at regions adjacent the processing volume 312, may have a thickness 344 of between about 2 mm and about 5 mm, such as about 3 mm. The relatively minimal amount of material comprising the liner 318 compared to the body 302 causes the liner 318 to have a small thermal mass relative to the thermal mass of the body 302. Accordingly, temperature changes within the processing volume 312 may be made in a more efficient manner as the temperature of the processing volume 312 is influenced predominantly by the liner 318, rather than the body 302. In one embodiment, a processing environment within the processing volume 312 may be cycled between about 20° C. and about 50° C. in an amount of time less than about 5 minutes, for example less than about 1 minute. In one embodiment, the processing volume 312 may be cycled between about 20° C. and about 50° C. in about 30 seconds.

The insulation element 316 is generally disposed within the body 302 adjacent the liner 318. In the illustrated embodiment, the insulation element 316 may be multiple apparatus. The insulation element 316 may general extend along a long axis of the processing volume 312 to further reduce the thermal mass of the liner 318 by insulating the liner 318 from the body 302. The insulation element 316 may be formed form a material suitable for use in a high pressure environment which has a coefficient of thermal expansion similar to the coefficient of thermal expansion for the materials utilized for the body 302 and the liner 318. In one embodiment, the insulation element 316 may be a ceramic material. Various examples of ceramic materials include aluminum oxide, aluminum nitride, silicon carbide, and the like. A thickness 346 of the insulation element 316 may be between about 0.1 inches and about 1.0 inch, such as about 0.5 inches.

The processing volume 312 has a volume of less than about 2 liters, for example, about 1 liter. A distance 348 spanning the processing volume 312 between the liner 318 may be less than about 5 cm, such as less than about 2 cm, for example, about 1 cm. In various embodiments, the processing volume 312 may be filled with various liquids, gases, and/or supercritical fluids depending on the conditions in the processing volume 312. In one embodiment, the processing volume 312 may be coupled to one or more solvent sources 320, 332, 336. A first solvent source 320 may be coupled to the processing volume 312 via a first conduit 322 through a top of the body 302. A second solvent source 332 maybe coupled to the processing volume 312 via a second conduit 334 through a sidewall of the body 302. A third solvent source 336 may be coupled to the processing volume 312 via a third conduit 338 through a bottom of the body 312. The solvent sources 320, 332, 336 may be configured to provide solvents to the processing volume from various entry ports, depending upon desired solvent introduction characteristics.

Suitable solvents which may be supplied to the processing volume 312 from the solvent sources 320, 332, 336 include acetone, isopropyl alcohol, ethanol, methanol, N-Methyl-2-pyrrolidone, N-Methylformamide, 1,3-Dimethyl-2-imidazolidinone, dimethylacetamide, and dimethyl sulfoxide, among others. Generally the solvent may be selected such that the solvent is miscible with liquid $CO_2$.

A first fluid source 324 may be coupled to the processing volume 312 via fourth conduit 326 through the top of the body 302. The first fluid source 324 is generally configured to provide a liquid or supercritical fluid to the processing volume 312. In one embodiment, the first fluid source 324 may be configured to deliver supercritical $CO_2$. In another embodiment, the fluid source 324 may be configured to deliver supercritical $CO_2$ to the processing volume 312. In this embodiment, heating apparatus and pressurization apparatus may be coupled to the fourth conduit 326 to facilitate phase transition of liquid $CO_2$ to supercritical $CO_2$ prior to entry into the processing volume 312. A second fluid source 356 may be similarly configured to the first fluid source 324. However, the second fluid source 356 may be coupled to the processing volume via a fifth conduit 358 through the bottom of the body 302. Delivery of liquid $CO_2$ and/or supercritical $CO_2$ may be selected from a top down (first fluid source 324) or bottom up (second fluid source 356) scheme, depending upon desired processing characteristics.

In operation, temperature of the processing volume 312 may be controlled, at least in part, by the temperature of the $CO_2$ provided to the processing volume 312. Additionally, liquid $CO_2$ and/or supercritical $CO_2$ may be provided to the processing volume 312 in an amount such that the entire processing volume is exchanged between about 1 time and about 5 times, for example, about 3 times. It is believed that repetitive processing volume turnover may facilitate solvent mixing with the $CO_2$ prior to formation of and/or delivery of supercritical $CO_2$ to the processing volume 312 during subsequent supercritical drying operations. To facilitate turnover and removal of fluids and gases from the processing volume 312, the processing volume 312 may be coupled to a fluid outlet 340 via a sixth conduit 342.

The chamber 300 also includes a substrate support 306 which may be coupled to a door 304 and a baffle plate 310 may be movably disposed within the processing volume 312. In one embodiment, the substrate support 306 and the door 304 may be a unitary apparatus. In another embodiment, the substrate 306 may be removably coupled to the door 304 and may move independently of the door 304. The door 304 and the substrate support 306 may be formed from various materials, including stainless steel, aluminum, ceramic material, polymeric materials or combinations thereof. The substrate support 306 may also have a heating element 354 disposed therein. The heating element 354 may be a resistive heater in one embodiment. In another embodiment, the heating element 354 may be a fluid filled channel formed in the substrate support 306. The heating element 354 may be configured to heat the processing volume 312 to facilitate formation or maintenance of a supercritical fluid in the processing volume 312.

In operation, the substrate support 306 may enter the processing volume 312 via an opening formed in the body 302 and the door 304 may be configured to abut the body 302 when the substrate support 306 is positioned within the processing volume 312. In one embodiment, the substrate support 306 is configured to move laterally. As a result, the distance 348 may be minimized because vertical movement of the substrate support 306 within the processing volume 312 is unnecessary. A seal 352, such as an o-ring or the like, may be coupled to the body 302 and the seal 352 may be formed from an elastomeric material, such as a polymeric material. Generally, the door 304 may be secured to the body 302 during processing via coupling apparatus (not shown), such as bolts or the like, with sufficient force to withstand a high pressure environment suitable to forming or maintaining a supercritical fluid in the processing volume 312.

The baffle plate 310 may be formed from various materials, including stainless steel, aluminum, ceramic materials, quartz materials, silicon containing materials, or other suitably configured materials. The baffle plate 310 may be coupled to an actuator 330 configured to move the baffle plate 310 towards and away from the substrate support 306. The actuator 330 may be coupled to a power source 328, such as an electrical power source to facilitate movement of the baffle plate 310 within the processing volume 312.

A substrate 308 may be positioned on the substrate support 306 during processing. In one embodiment, a device side 314 of the substrate 308 may be positioned adjacent the substrate support 306 such that the device side 314 faces away from the baffle plate 310. In operation, the baffle plate 310 may be in a raised position when the substrate 308 is being positioned within the processing volume 312. The baffle plate 310 may be lowered via the actuator 330 to a processing position in close proximity with the substrate 308 during processing. After processing, the baffle plate 310 may be raised and the substrate support 306 may remove the substrate 308 from the processing volume 312 through the opening 350 in the body 302. It is believed that by positioning the baffle plate 310 in close proximity with the substrate 308 and the substrate support 306, particle deposition on the device side 314 of the substrate 308 may be reduced or eliminated during introduction of solvents and/or liquid/supercritical $CO_2$ to the processing volume 312.

Figure 4:
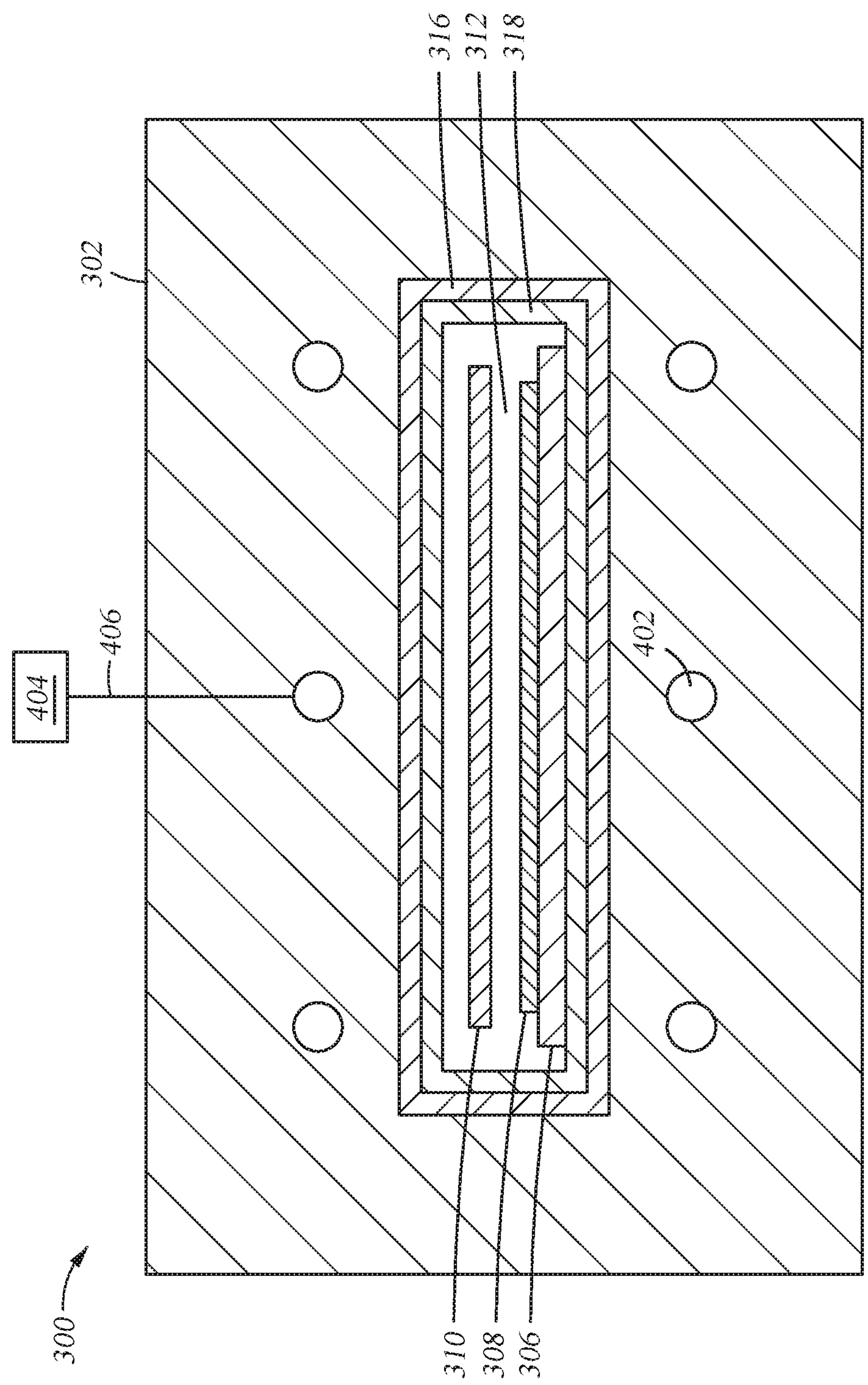
FIG. 4 schematically illustrates a sectional side view of a small thermal mass processing chamber according to one embodiment described herein.

FIG. 4 schematically illustrates a sectional side view of the chamber 300 according to one embodiment described herein. In the illustrated embodiment, the liner 318 may entirely surround and define the processing volume 312. In this embodiment, the insulation element 316 may entirely surround the liner 318. In certain embodiments, the insulation element 316 may not entirely surround the liner 318. For example, the short axis of the liner 318 may not be encased with the insulation element 316.

One or more fluid conduits 402 may be disposed in the body 302. The fluid conduits 402 may be coupled to a thermal management fluid source 404 via a seventh conduit 406. The fluid source 404 may be configured to provide a fluid, such as water, ethylene glycol, or the like, to the fluid conduits 402 to control the temperature of the body 302. Accordingly, the fluid conduits 402 may be utilized to heat or cool the body 302 and facilitate thermal cycling of the chamber 300.

Figure 5:
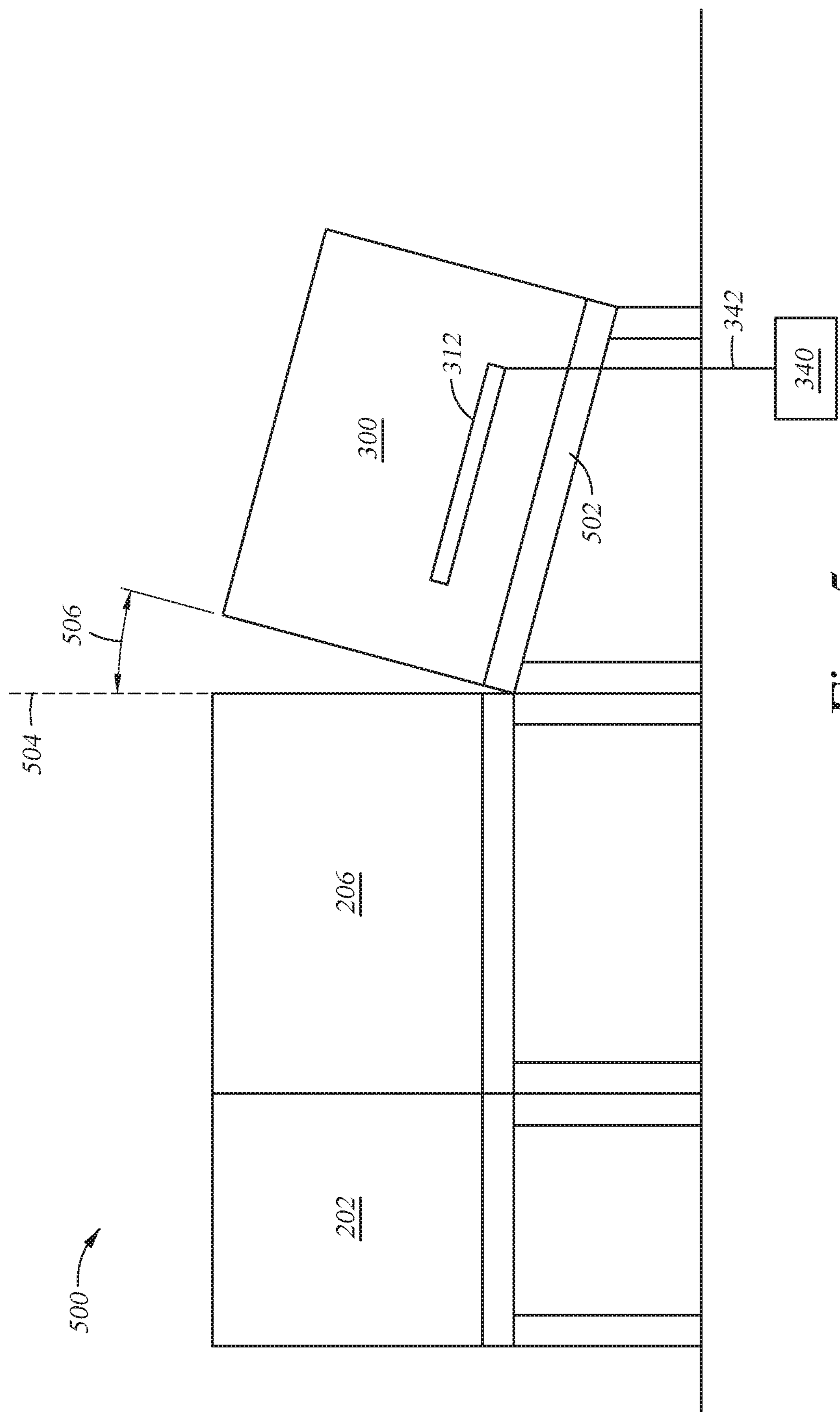
FIG. 5 schematically illustrates a side view of a processing platform incorporating a small thermal mass processing chamber according to embodiments described herein.

FIG. 5 schematically illustrates a side view of a processing platform 500 incorporating the chamber 300 according to embodiments described herein. It is contemplated that the platform 500 may be similar to the processing apparatus 200 or the processing apparatus 200A. Generally, the chamber 300 maybe coupled to the transfer chamber 206, both of which may be disposed on the platform 500. In the illustrated embodiment, the chamber 300 may be angled or tilted from a horizontal orientation. In this embodiment, the chamber 300 may be disposed at an angle 506 relative to an axis defined by a datum plane 504. In one embodiment, the angle 506 which determines the tilted orientation of the chamber 300 may be between about 10° and about 90° relative to the datum plane 504. A chamber support 502 may be coupled to the chamber 300 and configured to support the chamber 300 in the tilted orientation.

The tilted orientation of the chamber 300 may advantageously enable filling of the processing volume 312 with a solvent prior to positioning the substrate 308 in the processing volume 312. As a result, the solvent contact with the substrate 308 may be maximized to prevent drying of the substrate 308 prior to performing solvent exchange and supercritical drying processes. The sixth conduit 342 may be coupled to the processing volume 312 at a position configured to collect substantially all of any fluid in the processing volume 312. In other words, the sixth conduit 342 may be coupled to the "lowest" region of the processing volume 312. Thus, when it is desirable to remove fluids, such as liquid solvents and/or liquid $CO_2$, from the processing volume, the fluids may outflow to the fluid outlet 340 in an efficient manner utilizing the force of gravity.

Embodiments described herein provide for an improved chamber for performing pressurized substrate processing operations. The chamber employs a small thermal mass adjacent the processing volume to enable temperature cycling. In addition, temperatures of the chamber may be controlled in a more efficient and timely manner. Thus, supercritical drying processes may be implemented with improved throughput and processing results.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:

disposing a substrate in a device side down orientation on a substrate support in a processing chamber with a processing volume, wherein the substrate support is coupled to a door of the processing chamber, the processing chamber including:

a liner disposed within the processing chamber adjacent the processing volume; and an insulation element disposed within the processing chamber and extending along a major axis of the processing volume, wherein the liner is in contact with the insulation element such that the liner is encased by the insulation element and separates the insulation element from the processing volume;

tilting the processing chamber with respect to gravity;

introducing a solvent to the processing volume in an amount to at least partially submerge the substrate;

moving a baffle plate from a raised position to a processing position adjacent to a non-device side of the substrate, wherein a device side of the substrate faces away from the baffle plate;

delivering liquid $CO_2$ to the processing volume and mixing the liquid $CO_2$ with the solvent;

delivering additional liquid $CO_2$ to the processing volume in an amount such that the entire processing volume is exchanged at least one time;

providing supercritical $CO_2$ to the processing volume; and exposing the substrate to the supercritical $CO_2$.

2. The method of claim 1, further comprising surrounding the substrate support with the liner having a thickness between about 2 mm and about 5 mm.

3. The method of claim 1, wherein the solvent is selected from the group consisting of acetone, isopropyl alcohol, ethanol, methanol, N-methyl-2-pyrrolidone, N-methylformamide, 1,3-dimethyl-2-imidazolidinone, dimethylacetamide, and dimethyl sulfoxide.

4. The method of claim 1, further comprising:

directing acoustic energy from a megasonic plate onto the non-device side of the substrate.

5. The method of claim 4, further comprising:

exposing the substrate to a plasma process to remove contaminants from the substrate and release line stiction of device structures formed on the substrate.

6. A substrate processing method, comprising:

transferring a substrate in a device side down orientation on a substrate support into a processing chamber with a processing volume, wherein the substrate support is coupled to a door of the processing chamber, the processing chamber including:

a liner disposed within the processing chamber adjacent the processing volume; and an insulation element disposed within the processing chamber and extending along a major axis of the processing volume, wherein the liner is in contact with the insulation element such that the liner is encased by the insulation element and separates the insulation element from the processing volume;

tilting the processing chamber with respect to gravity;

introducing a solvent to the processing volume in an amount to at least partially submerge the substrate;

positioning a baffle plate adjacent to a non-device side of the substrate, wherein a device side of the substrate faces away from the baffle plate;

providing supercritical $CO_2$ to the processing volume; and exposing the substrate to the supercritical $CO_2$.

7. The method of claim 6, wherein the baffle plate is moved toward the substrate support prior to providing the supercritical $CO_2$.

8. The method of claim 1, further comprising providing a liquid comprising $CO_2$ to the processing chamber.

9. The method of claim 6, further comprising surrounding the substrate support with the liner having a thickness between about 2 mm and about 5 mm.

10. The method of claim 9, further comprising insulating the liner from the processing chamber.

11. The method of claim 6, wherein the solvent is selected from the group consisting of acetone, isopropyl alcohol, ethanol, methanol, N-methyl-2- pyrrolidone, N-methylformamide, 1,3-dimethyl-2-imidazolidinone, dimethylacetamide, and dimethyl sulfoxide.

12. The method of claim 11, wherein the providing supercritical $CO_2$ to the processing chamber further comprises:

cycling a temperature within the processing chamber between about 20 ° C. and about 50 ° C. in less than about 5 minutes.

13. A substrate processing method, comprising:

transferring a substrate from a substrate cassette to a wet cleaning chamber via a dry robot;

exposing a substrate to a de-ionized water cleaning process;

transferring the substrate to a solvent exchange chamber via a wet robot;

displacing residual de-ionized water from the substrate;

transferring the substrate to a supercritical fluid chamber with a chamber volume;

exposing the substrate to a supercritical fluid cleaning and drying process, the supercritical fluid cleaning and drying process comprising:

disposing a substrate in a device side down orientation on a substrate support in a processing chamber with a processing volume, wherein the substrate support is coupled to a door of the processing chamber, the processing chamber including:

a liner disposed within the processing chamber adjacent the processing volume; and an insulation element disposed within the processing chamber and extending along a major axis of the processing volume, wherein the liner is in contact with the insulation element such that the liner is encased by the insulation element and separates the insulation element from the processing volume;

tilting the processing chamber with respect to gravity;

introducing a solvent to the processing volume in an amount to at least partially submerge the substrate;

positioning a baffle plate adjacent to a non-device side of the substrate;

wherein a device side of the substrate faces away from the baffle plate;

providing supercritical fluid to the processing volume; and exposing the substrate to the supercritical fluid;

transferring the substrate to a post processing chamber via the wet robot; and exposing the substrate to a plasma process to remove contaminants from the substrate and release line stiction of device structures formed on the substrate.

14. The method of claim 13, wherein the baffle plate is moved toward the substrate support prior to providing the supercritical fluid.

15. The method of claim 13, further comprising providing a liquid comprising $CO_2$ to the processing chamber.

16. The method of claim 13, wherein the providing supercritical fluid to the processing chamber further comprises:

cycling a temperature within the processing chamber between about 20 ° C. and about 50 ° C. in less than about 1 minute.

17. The method of claim 13, further comprising surrounding the substrate support with the liner having a thickness between about 2 mm and about 5 mm.

18. The method of claim 17, further comprising insulating the liner from the processing chamber.

19. The method of claim 13, wherein the wet cleaning chamber is a horizontal spinning chamber.

20. The method of claim 19, further comprising:

directing acoustic energy from a megasonic plate onto a non-device surface of the substrate disposed in the horizontal spinning chamber.

* * * * *